US010367502B2

(12) United States Patent
Lum et al.

(10) Patent No.: US 10,367,502 B2
(45) Date of Patent: Jul. 30, 2019

(54) ISOLATION DEVICE WITH HALF DUPLEX CHANNEL

(71) Applicant: Avago Technologies International Sales Pte. Limited, Singapore (SG)

(72) Inventors: Richard Lum, Singapore (SG); Thiam Siew Tay, Singapore (SG); Yuen Yin Chan, Singapore (SG)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 15/496,964

(22) Filed: Apr. 25, 2017

(65) Prior Publication Data

US 2018/0309444 A1    Oct. 25, 2018

(51) Int. Cl.
| | |
|---|---|
| *H03K 17/79* | (2006.01) |
| *H04B 10/80* | (2013.01) |
| *H03K 17/795* | (2006.01) |
| *G02B 6/42* | (2006.01) |
| *G06F 13/40* | (2006.01) |
| *H04B 10/40* | (2013.01) |
| *H04B 1/16* | (2006.01) |

(52) U.S. Cl.
CPC ........... *H03K 17/79* (2013.01); *G02B 6/4246* (2013.01); *G06F 13/4022* (2013.01); *H03K 17/7955* (2013.01); *H04B 1/1615* (2013.01); *H04B 10/40* (2013.01); *H04B 10/801* (2013.01); *H04B 10/802* (2013.01)

(58) Field of Classification Search
CPC .. H03K 17/79; H03K 17/7955; G02B 6/4246; G02B 6/4214; G02B 6/4292; H04B 10/40; H04B 10/152; H04B 1/1615; G06F 13/4022
See application file for complete search history.

(56) References Cited

U.S. PATENT DOCUMENTS

| | | | |
|---|---|---|---|
| 4,773,074 | A | 9/1988 | Hunsperger et al. |
| 5,349,462 | A | 9/1994 | Defranco et al. |
| 5,399,853 | A | 3/1995 | Maurice |
| 6,388,264 | B1 | 5/2002 | Pace |
| 2012/0076455 | A1 | 3/2012 | Siew et al. |
| 2015/0365166 | A1* | 12/2015 | Deyle .................. H04B 10/116 398/118 |

* cited by examiner

*Primary Examiner* — Ted M Wang
(74) *Attorney, Agent, or Firm* — Sheridan Ross P.C.

(57) ABSTRACT

An isolation system and isolation device are disclosed. An illustrative isolation device is disclosed to include first circuitry having at least a first emitter and a first detector, second circuitry having at least a dual-purpose component, an isolation material configured to electrically isolate the first circuitry from the second circuitry, and switching circuitry adapted to connect the dual-purpose component to emit a first signal for detection by the first detector in a first configuration, and to receive a second signal from the first emitter in a second configuration.

20 Claims, 11 Drawing Sheets

ISOLATION DEVICE WITH HALF DUPLEX CHANNEL

FIELD OF THE DISCLOSURE

The present disclosure is generally directed toward electronic isolation and devices for accommodating the same.

BACKGROUND

There are many types of electrical systems that benefit from electrical isolation. Galvanic isolation is a principle of isolating functional sections of electrical systems to prevent current flow, meaning that no direct electrical conduction path is permitted between different functional sections. As one example, certain types of electronic equipment require that high-voltage components (e.g., 1 kV or greater) interface with low-voltage components (e.g., 10V or lower). Examples of such equipment include medical devices and industrial machines that utilize high-voltage in some parts of the system, but have low-voltage control electronics elsewhere within the system. The interface of the high-voltage and low-voltage sides of the system relies upon the transfer of data via some mechanism other than electrical current.

Other types of electrical systems such as signal and power transmission lines can be subjected to voltage surges by lightning, electrostatic discharge, radio frequency transmissions, switching pulses (spikes), and perturbations in power supply. These types of systems can also benefit from electrical isolation.

Electrical isolation can be achieved with a number of different types of devices. Some examples of isolation products include galvanic isolators, opto-couplers, inductive, and capacitive isolators. Previous generations of electronic isolators used two chips in a horizontal configuration with wire bonds between the chips. These wire bonds provide a coupling point for large excursions in the difference between the grounds of the systems being isolated. These excursions can be on the order of 25,000 V/usec.

As mentioned above, electrical isolation can be achieved with capacitive, inductive isolators, optical, and/or RF isolators to transmit data across an isolation boundary. There is a desire to add more optical channels to optical couplers in an attempt to meet the complex functionality requirements for various applications. However, there are concerns with respect to chip space utilization and chip pin utilization. Simply adding more channels to an optical coupler will increase package size and/or pin counts, which translates to a larger footprint on a Printed Circuit Board (PCB), which is generally undesirable in end products. It is a challenge to incorporate additional features into an existing number of channels already established in an optocoupler package.

BRIEF DESCRIPTION OF THE DRAWINGS

The present disclosure is described in conjunction with the appended figures, which are not necessarily drawn to scale.

DETAILED DESCRIPTION

Figure 1:
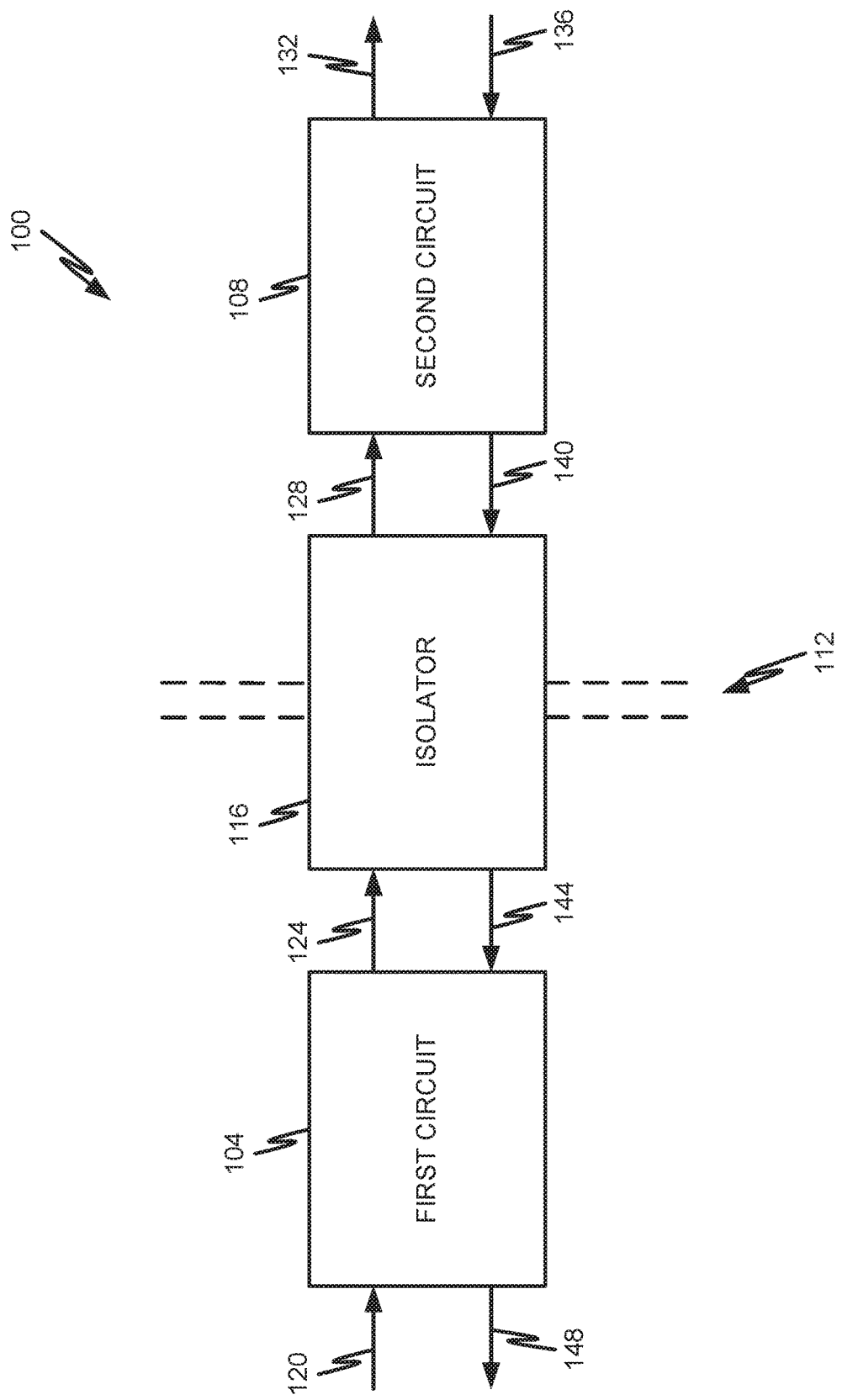
FIG. 1 is a schematic block diagram depicting an isolation system in accordance with embodiments of the present disclosure.

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Various aspects of the present disclosure will be described herein with reference to drawings that are schematic illustrations of idealized configurations. As such, variations from the shapes of the illustrations as a result, for example, manufacturing techniques and/or tolerances, are to be expected. Thus, the various aspects of the present disclosure presented throughout this document should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present disclosure.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" or "established" on another element, it can be grown, deposited, etched, attached, connected, coupled, or otherwise prepared or fabricated on the other element or an intervening element.

Furthermore, relative terms, such as "lower" or "bottom" and "upper" or "top" may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" side of the other elements. The term "lower" can, therefore, encompass both an orientation of "lower" and "upper" depending of the particular orientation of the apparatus. Similarly, if an apparatus in the drawing is turned over, elements described as "below" or "beneath" other elements would then be oriented "above" the other elements. The terms "below" or "beneath" can therefore encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Referring now to FIGS. 1-10, various configurations of isolation systems, isolators, and isolation devices are depicted and described. In some embodiments, the isolators described herein may be incorporated into any system which requires current and/or voltage monitoring, but is susceptible to transients. In some embodiments, the isolation system in which an isolator described herein is rated to operate at about 5 kV, 10 kV, or more. Stated another way, the input side (e.g., a high-voltage side) of the isolator or isolation system may be directly connected to a 5 kV, 10 kV, 15 kV or greater source without damaging the isolator or any electronic devices attached to the output side (e.g., a low-voltage side) of the isolator. Accordingly, an isolation system which employs one or more of the isolators disclosed herein may be configured to operate in high-voltage or high-current systems but may also be configured to separate the high-voltage or high-current systems from a low-voltage or low-current system.

Referring now to FIG. 1, a first isolation system 100 will be described in accordance with at least some embodiments of the present disclosure. The system 100 is shown to include a first circuit 104 and second circuit 108 separated by an isolation boundary 112. In some embodiments, an isolator 116 may provide a mechanism for carrying communication signals across the isolation boundary 112.

The first circuit 104 may be operating in a high-voltage environment (e.g., with a ground potential at or exceeding 1 kV) whereas the second circuit 108 may be operating in a low-voltage environment (e.g., with a ground potential below 100V). Of course, the opposite condition may also be true without departing from the scope of the present disclosure. The isolation boundary 112 may provide the mechanism for protecting the low-voltage environment from the high-voltage environment. The isolator 116 may be configured to establish and maintain the isolation boundary 112 while simultaneously facilitating the exchange of communications from the first circuit 104 to the second circuit 108 and vice versa. It should be appreciated, however, that the second circuit 108 may be operating in the high-voltage environment and the first circuit 104 may be operating in the low-voltage environment.

In some embodiments, the first circuit 104 receives a first input signal 120 at a first voltage (e.g., a high voltage). The first circuit 104 outputs a first output signal 124 to the isolator 116. The first output signal 124 is still at the same nominal voltage as the first input signal 120. The isolator 116 communicates information from the first output signal 124 to the second circuit 108 via a second input signal 128. The second input signal 128 is now as a second voltage (e.g., a low voltage) by operation of the isolator 116. The second circuit 108 then processes the second input signal 128 and generates a second output signal 132 that is communicated to additional circuitry or controller components.

Conversely, to facilitate a bi-directional flow of information across the isolation boundary 112, a third input signal 136 may be received at the second circuit 108. The second circuit 108 may generate a third output signal 140 based on the third input signal 136. The third output signal 140 may be provided to the isolator 116. In some embodiments, the third output signal 140 is nominally at a similar voltage to the second input signal 128. The isolator 116 may operate on the third output signal 140 in a similar fashion to the way that the first output signal 124 is processed, except in reverse. Specifically, the isolator 116 may produce a fourth input signal 144 that carries information previously contained in the third output signal 140. The fourth input signal 144 may be nominally at a similar voltage to the first output signal 124. The further input signal 144 may be provided to the first circuit 104, which produces a fourth output signal 148 based on the fourth input signal 144.

Even though the first circuit 104 operates at a different voltage than the second circuit 108 and there is an electrical isolation between the two circuits 104, 108, the isolator 116 is able to preserve the information from the first output signal 124 and communicate that information to the second circuit 108 via the second input signal 128. The second input signal 128 may correspond to a logical representation or copy of the first output signal 124. The second input signal 128 is essentially a reproduction of the first output signal 124 on different circuitry and at a different potential. Likewise, the isolator 116 is able to preserve information from the third output signal 140 and communicate that information to the first circuit 104 via the fourth input signal 144. The fourth input signal 144 is essentially a reproduction of the third output signal 140 on different circuitry and at a different potential. It should be appreciated that the isolator 116 may be designed to carry information across the isolation boundary 112 in two different directions, either sequentially or simultaneously.

Figure 2:
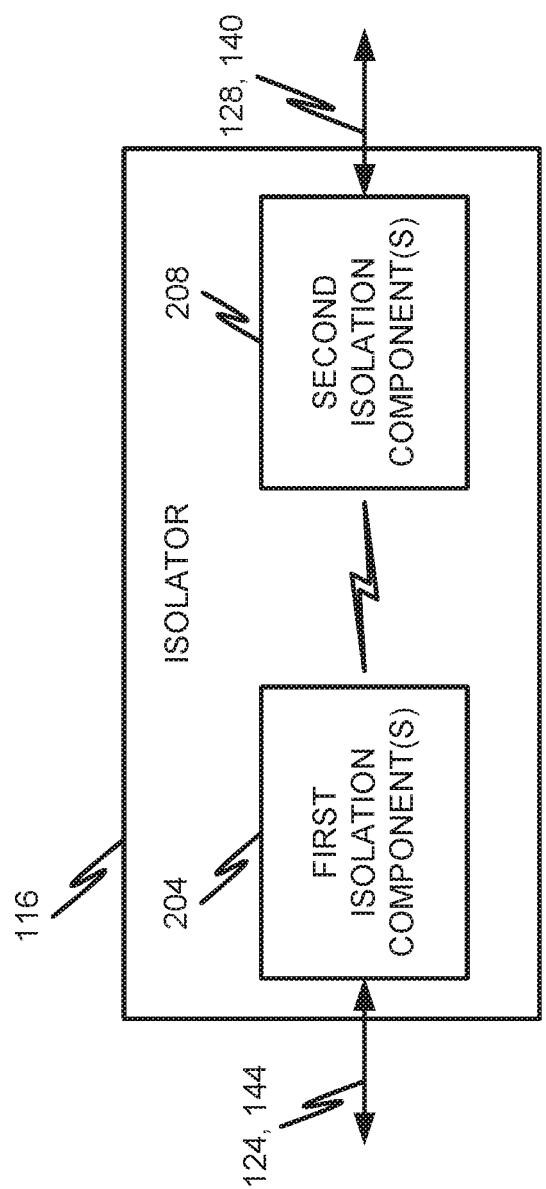
FIG. 2 is a schematic block diagram depicting details of an isolator in accordance with embodiments of the present disclosure.

With reference now to FIG. 2, additional details of the isolator 116 will be described in accordance with at least some embodiments of the present disclosure. The isolator 116, as discussed above, is responsible for communicating information between the first circuit 104 and second circuit 108 while simultaneously maintaining the isolation boundary 112 between the circuits 104, 108. Communication of the signal 124 across the isolation boundary 112 is achieved by one or more isolation components 204, 208, which may correspond to optical or optoelectronic isolation components as will be discussed in further detail herein.

The isolator 116 may comprise first isolation component(s) 204 on its first side and second isolation component(s) 208 on its second side. The first isolation component(s) 204 and second isolation component(s) 208 may correspond to optoelectronic devices (e.g., LEDs, photodetectors, photodiodes, lasers, etc.) or the like that work together to communicate signals between one another wirelessly, thereby maintaining the isolation boundary 112. In some embodiments, the isolation components 204, 208 communicate with one another via optical coupling (e.g., by the transmission and reception of optical signals in the form of photons). Other coupling techniques such as inductive coupling, magnetic coupling, capacitive coupling, or the like may also be used by isolator 116.

Figure 3A:
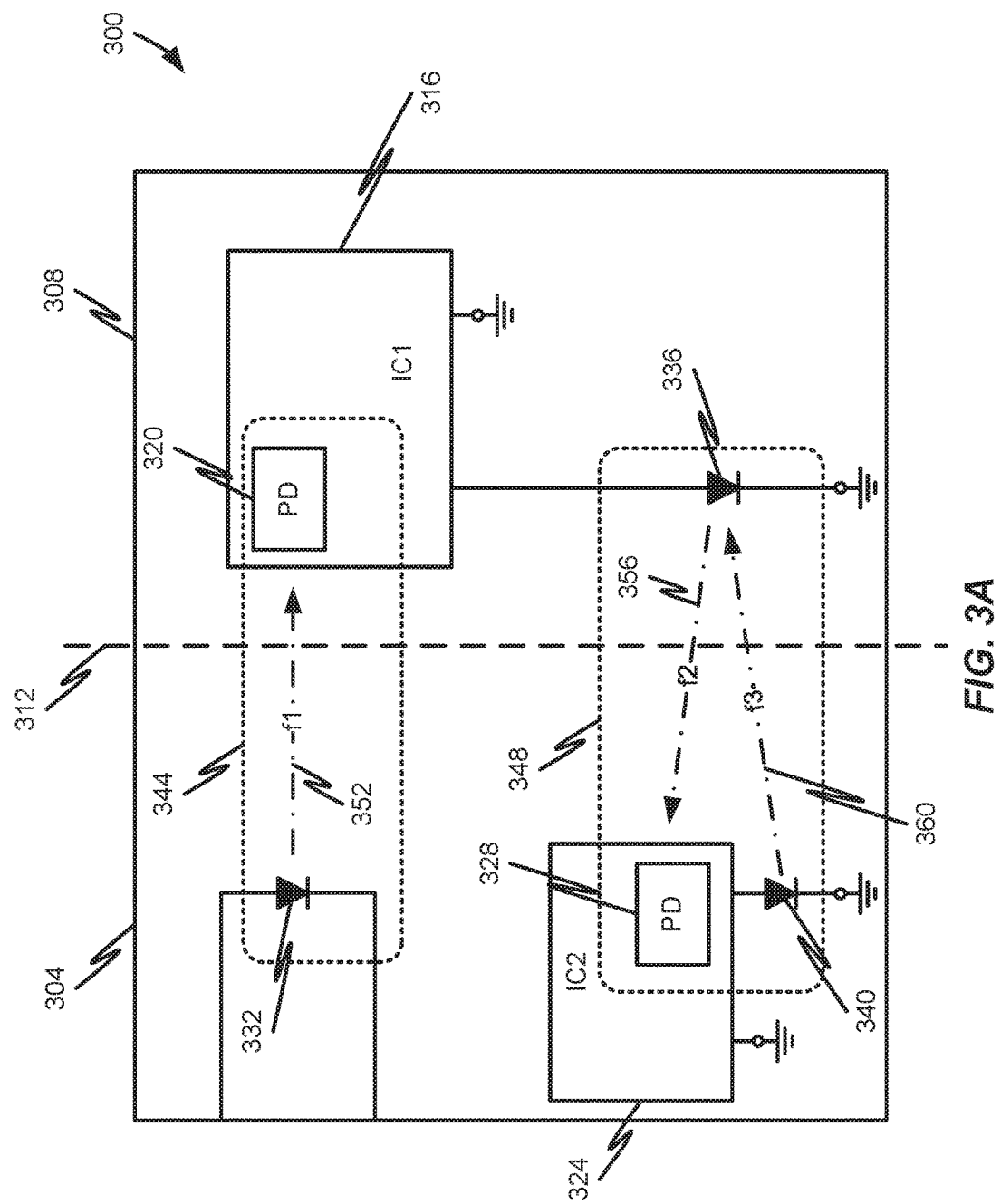
FIG. 3A is a block diagram of a first illustrative isolation device in accordance with embodiments of the present disclosure.
Figure 3B:
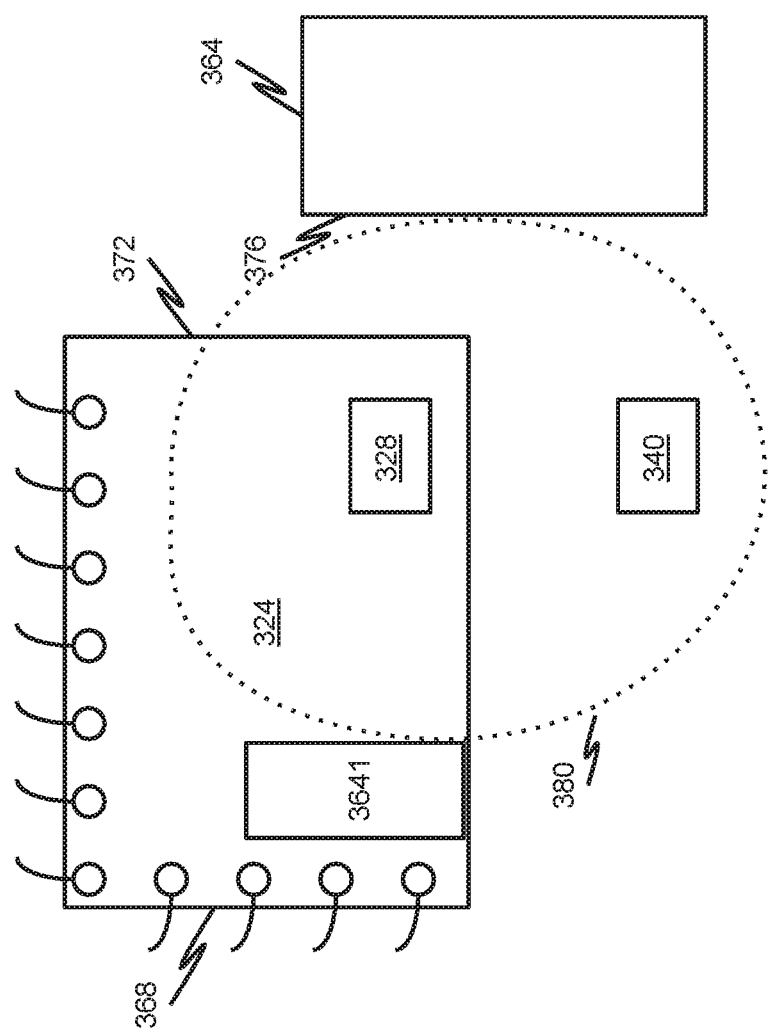
FIG. 3B is a detailed block diagram of the first illustrative isolation device from FIG. 3A with an exemplary mechanism used to control encapsulant deposits in accordance with embodiments of the present disclosure.
Figure 4:
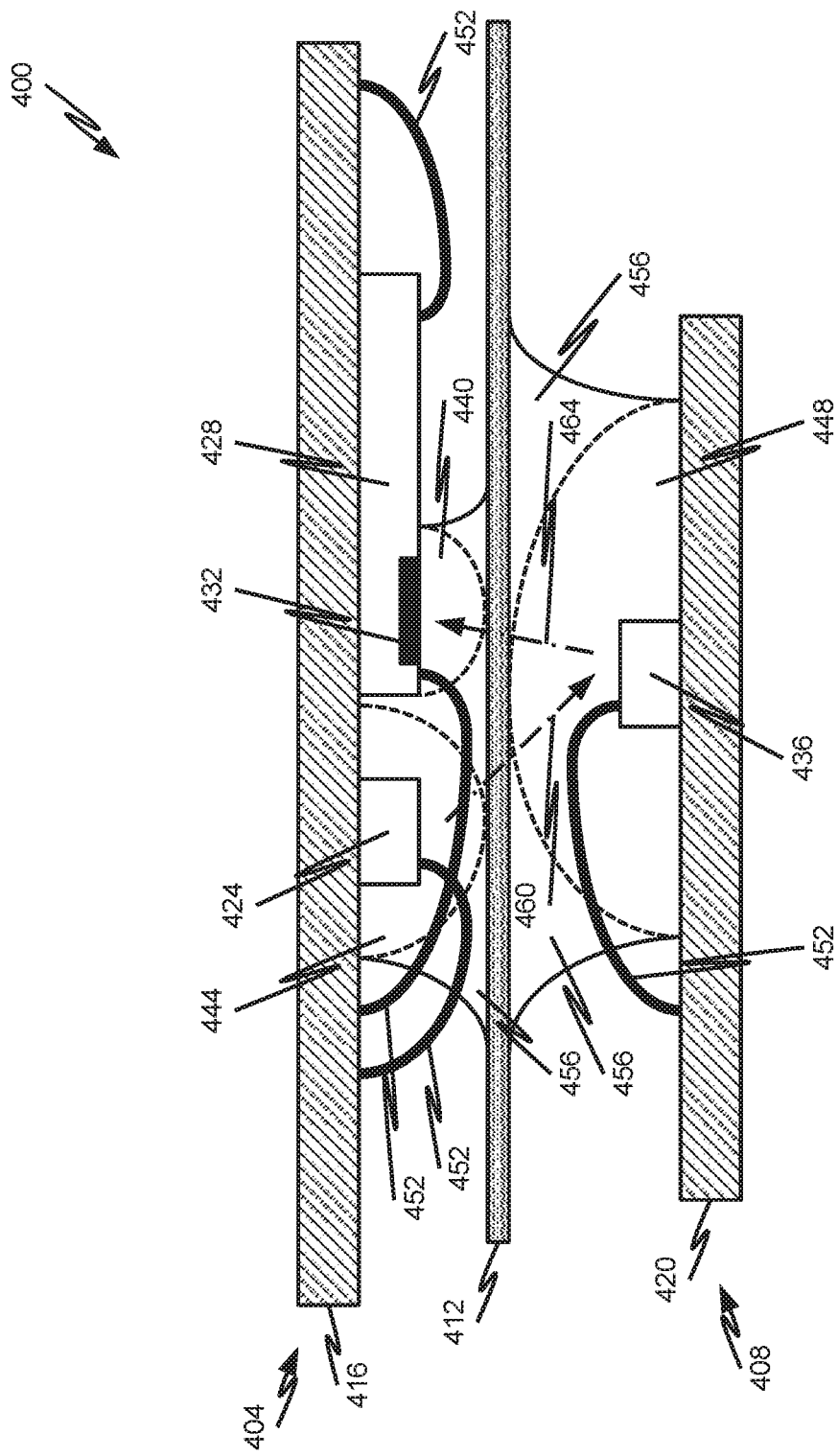
FIG. 4 is a cross-sectional view of the first illustrative isolation device in accordance with embodiments of the present disclosure.

FIGS. 3A and 3B depict a first illustrative example of an isolation device 300 in accordance with at least some embodiments of the present disclosure. FIG. 4 illustrates a similar isolation device 400 to that depicted in FIG. 3, with the exception that isolation device 400 shows a physical layout of some isolation components that may be included in the isolation device 300, 400. Unless otherwise described, it should be appreciated that similar components in isolation devices 300, 400 may have similar or identical features/functions without departing from the scope of the present disclosure.

With reference initially to FIGS. 3A and 3B, the isolation device 300 is shown to include first circuitry 304 and second circuitry 308 separated by an isolation boundary 312. In some embodiments, the isolation boundary 312 may be an optional element of isolation device 300.

The first circuitry 304 includes a first emitter 332, a first Integrated Circuit (IC) chip 324, and a second emitter 340. A second detector 328 may be included or integrated into the second IC chip 324. Each component of the first circuitry 304 may be mounted on a common lead or leadframe of an optoelectronic isolation or communication package. Alternatively or additionally, some components of the first circuitry 304 may be mounted on a first leadframe or substrate and other components of the first circuitry 304 may be mounted on a second leadframe or substrate.

The second circuitry 308 includes a first IC chip 316 and a dual-purpose optoelectronic component 336. A first detector 320 may be included or integrated into the first IC chip 316. In some embodiments, the first emitter 332 produces a first optical signal 352 that is detected at the first detector 320 and converted into an electrical signal within the first IC chip 316. This first optical signal 352 may be communicated via a first communication channel 344. The first communication channel 344 may be optically isolated from a second communication channel 348, which exists between the dual-purpose optoelectronic component 336 and the second detector 328/second emitter 340. The second communication channel 348 may carry a second optical signal 356 and/or a third optical signal 360. The second optical signal 356 may travel from the dual-purpose optoelectronic component 336 to the second detector 328 on the second IC 324 whereas the third optical signal may travel from the second emitter 340 to the dual-purpose optoelectronic component 336.

In some embodiments, the emitters 332, 340 may correspond to any type of optoelectronic device capable of receiving an electronic signal as an input and producing an optical signal in response thereto. Non-limiting examples of suitable emitters 332, 340 include LEDs, lasers, VCSELS, an array of LEDs, an array of lasers, combinations thereof, and the like.

In some embodiments, the detectors 320, 328 may correspond to any type of optoelectronic device capable of receiving an optical signal as an input and producing an electrical signal in response thereto. The detectors 320, 328 may provide their electrical signal outputs to their respective IC chips 316, 324, respectively, for further processing. Non-limiting examples of suitable detectors 320, 328 include photodiodes, an array of photosensitive cells provided on an IC chip, or the like.

The dual-purpose optoelectronic component 336 may correspond to an optoelectronic device that is capable of operating as a light emitter in a first operating configuration/condition and that is capable of operating as a light detector in a second operating configuration/condition. As a non-limiting example, the dual-purpose optoelectronic component 336 may correspond to a diode that acts as an LED in a first operating configuration and that acts as a photodiode in a second operating configuration. When operating in the first operating configuration the dual-purpose optoelectronic device 336 may produce the second optical signal 356. The second optical signal 356 may be used to convey high-speed fault information and/or status information related to the second circuitry 308. In some embodiments, the second optical signal 356 is communicated relatively quickly (e.g., as a fast signal). When operating in the second operating configuration, the dual-purpose optoelectronic device 336 may receive the third optical signal 360 and produce an electrical signal in response thereto. The third optical signal 360 travels through the same communication channel as the second optical signal 356 (e.g., the second communication channel 348), but travels in a direction opposite to the second optical signal 356. The third optical signal 360 may communication status or sensor information from the first circuitry 304 to the second circuitry 308. As compared to the second optical signal 356, the third optical signal 360 may be relatively slower (e.g., modulated slower, activated/deactivated slower, turned on/off slower, etc.) as compared to the second optical signal 356.

The first optical signal 352 is transmitted at a first rate (f1), the second optical signal 356 is transmitted at a second rate (f2) and the third optical signal 360 is transmitted at a third rate (f3). The first rate (f1) is substantially at the same speed as the second rate (f2). The third rate (f3) is slower than the first rate (f1) and the second rate (f2). In one embodiment, the first rate (f1) and the second rate (f2) may be at least 50% faster than the third rate (f3). In another embodiment, the first rate (f1) and the second rate (f2) may be at least 2 times the third rate (f3). For example, the first and second rates may be in few MHz, while the third rate may be in the order of few hundred kHz.

In some embodiments, the dual-purpose optoelectronic component 336 is connected to a separate ground than the first IC chip 316. Such a configuration may enable the dual-purpose optoelectronic component 336 to be appropriately biased to allow the dual-purpose optoelectronic component 336 to toggle or switch between operating as an emitter and operating as a detector. More specifically, the dual-purpose optoelectronic component 336 may be forward biased to enable the dual-purpose optoelectronic component 336 to emit the second optical signal 356 and operate in the first operating configuration. Conversely, the dual-purpose optoelectronic component 336 may be reverse biased to enable the dual-purpose optoelectronic component 336 to receive the third optical signal 360. The circuitry responsible for switching the biasing of the dual-purpose optoelectronic component 336 may reside in or be part of the first IC chip 316.

FIG. 3B depicts the isolation device 300 during manufacture. In particular, a detailed view of the second IC chip 324 and the second emitter 340 is depicted. A limiting structure 364 is also depicted as a component used during the manufacture of the isolation device 300. In some embodiments, it is desirable to encapsulate the optical components with an encapsulant material 380 that helps establish the second communication channel 348 (and first communication channel 344 as well).

The encapsulant material 380 may correspond to an electrically-insulative material that is also optically transparent to light emitted by the second emitter 340 (and other emitters of the isolation device 300). In some embodiments, it may be desirable to encapsulate the optical components with the encapsulant material 380 but not encapsulate other portions of the second IC chip 324 with the encapsulant material 380. In particular, the second IC chip 324 is shown to have a first side 368 and a second side 372. There are a number of electrical bonding pads provided adjacent to the first side 368 of the second IC chip 324 and the second detector 328 is shown as being adjacent or closer to the second side 372 of the second IC chip 324. This means that it may be desirable to deposit the encapsulant material 380 in such a way that most of the second side 372 of the second IC chip 324 is covered whereas the first side 368 of the second IC chip 324 is not covered by the encapsulant material 380. It may also be desirable to ensure that the encapsulant material 380 does not flow so far that it crosses the isolation boundary 312 or otherwise comes into contact with components like the dual-purpose optoelectronic component 336. Unfortunately, the distribution (e.g., size and shape) of the encapsulant material 380 may be difficult given the nature of the material and the fact that a dispensing unit may not be capable of precision dispensing operations. To address this issue, the limiting structure 364 may be provided as a way to limit the size and/or shape of the encapsulant material 380 when deposited on the first circuitry 304. The limiting structure 364 shown in FIG. 3B is illustratively drawn to represent a structure that may be employed to limit the size of the encapsulant material 380. Alternatively, the limiting structure 364 or an additional limiting structure 3641 may be placed between the second detector 328 and the wire bonds.

The limiting structure 364 helps to ensure that the encapsulant material 380 does not leak across the isolation boundary 312. Additionally, use of the limiting structure 364 allows the center of the encapsulant material 380 to be moved away from the center of the second IC chip 324. This may enable the bonding pads on the first side 368 of the second IC chip 324 to not have the encapsulant material 380 provided thereon whereas the encapsulant material 380 may be enabled to simultaneously cover the second detector 328 and second emitter 340. Thus, the encapsulant material 380 may be able to encapsulate some of the second side 372 of the second IC chip 324 but not the first side 368 of the second IC chip 324.

In some embodiments, the limiting structure 364 may correspond to any type of material or collection of materials that help to prevent a flow of the encapsulant material 380 when the material is in a liquid form. Non-limiting examples of a suitable limiting structure 364 include a dummy wire, a dummy chip, a leadframe material, tape, and a solid structure attached adjacent to the second IC chip 324 and near the second side 372 of the second IC chip 324. As will be discussed in connection with FIG. 4, the limiting structure 364 helps to establish a sub-chamber over the second IC chip 324 that protects the second detector 328 but also acts as a light-guide during operation of the isolation device 300. As can be appreciated, the limiting structure 364 can be used to control the size and/or shape of the encapsulant material 380, which effectively controls the size and/or shape of the sub-chamber created thereby.

With reference now to FIG. 4, one possible physical configuration for an isolation device 400 will be described in accordance with at least some embodiments of the present disclosure. The isolation device 400 may only correspond to a portion of isolation device 300, meaning that not all components of isolation device 300 are depicted in connection with the isolation device 400. It should be appreciated, however, that isolation device 400 may include all components depicted and described in connection with isolation device 300. For ease of discussion and illustration, isolation device 400 only depicts the components used for communicating via the second communication channel 348.

The isolation device 400 is shown to include a first side 404 and a second side 408 that is electrically isolated from the first side 404. In some embodiments, the elements on the first side 404 may correspond to elements provided on the first circuitry 304 whereas elements on the second side 408 may correspond to elements provided on the second circuitry 308. Specifically, the first side 404 is shown to include a first substrate or leadframe 416 supporting a second emitter 424 and second IC chip 428. The second side 408 is shown to include a second substrate or leadframe supporting the dual-purpose optoelectronic component 436. In some embodiments, the second emitter 424 is similar or identical to second emitter 340, the second IC chip 428 is similar or identical to second IC chip 324, the second detector 432 is similar or identical to the second detector 328, and the dual-purpose optoelectronic component 436 is similar or identical to dual-purpose optoelectronic component 336. These similarities are not a requirement, however.

The first side 404 is electrically isolated from the second side 408 by an isolation material 412. In some embodiments, the isolation material 412 corresponds to an electrically-insulative material that is also optically transparent (completely or partially) to the wavelength of light produced by components 424, 436. Non-limiting examples of the isolation material 412 include Kapton® tape, glass, an insulative film, or the like. The isolation material 412 helps to establish and maintain the isolation boundary 312.

The second emitter 424 is shown as being directly mounted on the first substrate or leadframe 416 in addition to being electrically connected to the first substrate or leadframe 416 via a wirebond 452. The second IC chip 428 is also shown to be directly mounted on the first substrate or leadframe 416 in addition to being electrically connected to the first substrate or leadframe 416 via wirebonds 452. The photosensitive area of the second IC chip 428 is shown to include the second detector 432. The second detector 432 and second emitter 424 are encapsulated or covered by transparent dispense dots 440, 444, respectively. The dispense dots may correspond to an amount of transparent material used to simultaneously protect the optoelectronic components on the first side 404 and maintain the second communication channel 348. In some embodiments, the dispensed dots 440, 444 may correspond to amounts of silicone deposited over the components 424, 432.

The dual-purpose optoelectronic component 436 is also shown to be encapsulated by a dispensed dot 448. In some embodiments, the dispensed dot 448 may correspond to an amount of silicone deposited over the dual-purpose optoelectronic component 436. Collectively, the dots 440, 444, 448 may help to create a lightguide or the like that establishes the second communication channel 348. It should be appreciated that for such an optical pathway to be established, it may be desirable to have the dots 440, 444, 448 overlap one another even though they are separated by the isolation material 412. Such an overlap may help to create an efficient optical pathway for the optical signals 460, 464. In some embodiments, optical signal 460 corresponds to the third optical signal while optical signal 464 corresponds to the second optical signal 356. In some embodiments, these optical signals 460, 464 are not transmitted at substantially the same time, thereby helping to avoid crosstalk, the introduction of noise, etc. Circuitry within the first IC chip 316 may help to ensure that the optical signals 460, 464 are not simultaneously transmitted.

The combination of the dispensed dots 440, 444, 448 may establish the second optical channel 348, for example, in the form of a light guide. In some embodiments, the light guide that establishes the second communication channel 348 may be considered to have a number of sub-chambers, where those sub-chambers correspond to the different dispensed dots during a manufacturing stage shown in dotted lines in FIG. 4. The sub-chambers are to be inter-connected when the isolation device 400 is completed. In some embodiments, the light guide includes a sub-chamber corresponding to the first dispensed dot 440, another sub-chamber corresponding to the second dispensed dot 444, and a third sub-chamber corresponding to the third dispensed dot 448. As discussed in connection with FIG. 3B, the size and/or shape of the sub-chamber corresponding to the first dispensed dot 440 may be controlled by the limiting structure 364. It should be appreciated that the size and/or shape of other sub-chambers may also be controlled by the limiting structure 364 or by other mechanisms not depicted. In a subsequent stage of the manufacturing process, the dispensed dots will be connected together as illustrated by the solid lines in FIG. 4. In a final manufactured form of the isolation device 400, the sub-chambers 440, 444 and 448 may be merged to define a single light guide 456 which is configured to direct the optical signals. In other words, in the final manufactured form of the isolation device 400, the first, second and third sub-chambers correspond to the light guide portions adjacent to the second detector 432, the second emitter 424 and the dual-purpose optoelectronic component 436 respectively. As shown in FIG. 4, a diameter of the sub-chamber corresponding to the first dispensed dot 440 may be smaller than a diameter of the sub-chamber corresponding to the second dispensed dot 444. Similarly, the diameter of the sub-chamber corresponding to the first dispensed dot 440 may be significantly smaller (e.g., less than half the size) than a diameter of the sub-chamber corresponding to the third dispensed dot 448. The isolation material 412 is shown as being sandwiched between the third dispensed dot 448 and the other dispensed dots 440, 444 on the first side 404. The sub-chambers corresponding to the second dispensed dot 444 and the first dispensed dot 440 that reside on the same side will be merged. The merged sub-chambers (shown as solid line on the first side) may have a size that is substantially similar to the sub-chamber corresponding to the third dispensed dot 448 after processing (shown as solid line on the second side).

In addition to providing an electrical connection, the wirebonds 452 may also be strategically used to support a placement and/or position of the isolation material 412 between the sides 404, 408.

Figure 5:
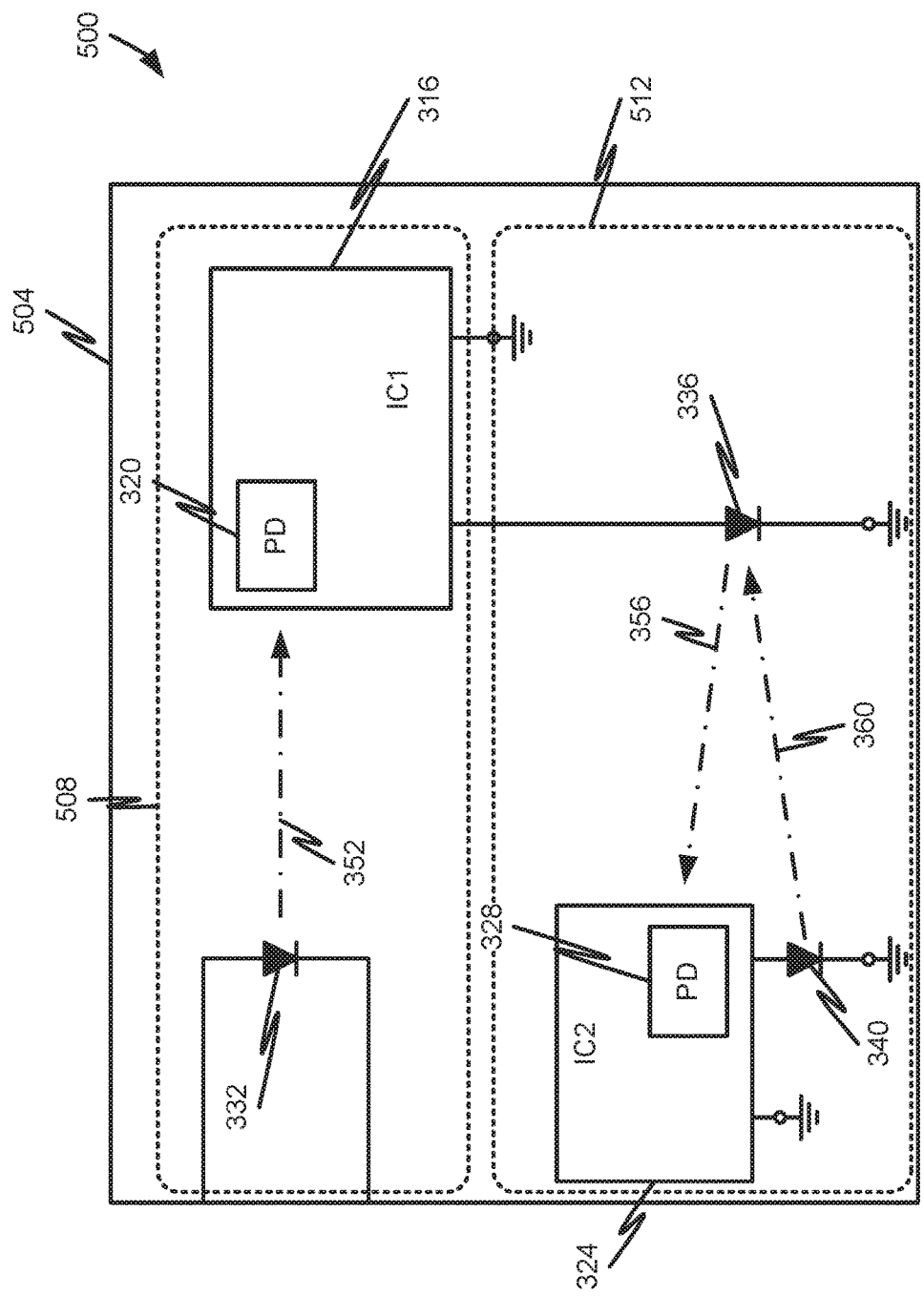
FIG. 5 is a block diagram of a second illustrative isolation device in accordance with embodiments of the present disclosure.
Figure 6:
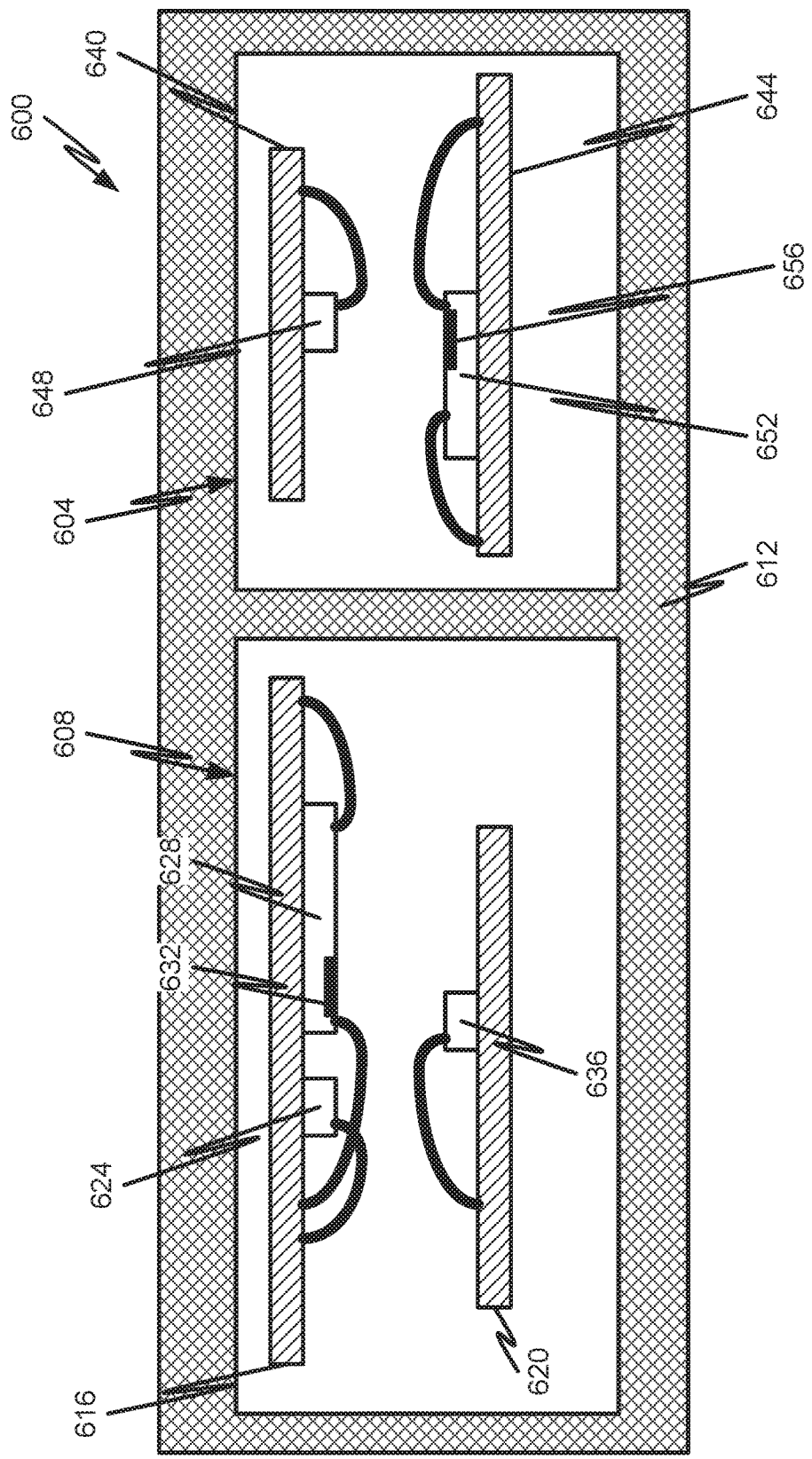
FIG. 6 is a cross-sectional view of the second illustrative isolation device in accordance with embodiments of the present disclosure.

FIG. 5 depicts a second illustrative example of an isolation device 500 in accordance with at least some embodiments of the present disclosure. FIG. 6 illustrates a similar isolation device 600 to that depicted in FIG. 5, with the exception that isolation device 600 shows a physical layout of some isolation components that may be included in the isolation device 500, 600. Unless otherwise described, it should be appreciated that similar components in isolation devices 500, 600 may have similar or identical features/functions without departing from the scope of the present disclosure.

With reference now to FIG. 5, the isolation device 500 is shown to include a package body 504 that houses components similar or identical to those depicted and described in connection with isolation device 300. The isolation device 500 further exhibits a first inner mold 508 and a second inner mold 512 provided in the package 504. In some embodiments, the first inner mold 508 helps to create or define the first communication channel 344 (which carries the first optical signal 352). The second inner mold 512 helps to create or define the second communication channel 348 (which carries the second optical signal 356 and third optical signal 360).

The first inner mold 508 may be provided in such a way as to surround the first emitter 332 and the first IC chip 316. The second inner mold 512 may be provided in such a way as to surround the second emitter 340, the second IC chip 324, and the dual-purpose optoelectronic component 336. In some embodiments, the ground terminals are contained within the second inner mold 512 rather than the first inner mold 508. It should be appreciated, however, that one or more of the ground terminals (or reference voltage terminals) may be provided in the first inner mold 508 without departing from the scope of the present disclosure.

In some embodiments, as shown in FIG. 6, the isolation device 600, which may be similar to isolation device 500, is shown to have a first communication channel 604 and second communication channel 608. As discussed above, the first communication channel 604 may be established with the first inner mold 508 and the second communication channel 608 may be established with the second inner mold 512. The first and second inner molds 508, 512 may include any type of translucent or transparent material, such as silicone, white plastic material, clear plastic material, etc. A mold separator 612 may be provided as an outer mold around the first and second inner molds 508, 512. The mold separator 612, in some embodiments, may establish the format of the package 504. The mold separator 612 may correspond to an outer mold material that is opaque or non-transparent to the light emitted by the emitters of the device 500, 600. As an example, the mold separator 612 may correspond to a black plastic or encapsulant material.

A set of substrates or leadframes 640, 644 are shown as being provided within the first communication channel 604. Substrate or leadframe 640 may support the first emitter 648, which may be similar or identical to first emitter 332. Substrate or leadframe 644 may support a first IC chip 652, which may be similar or identical to first IC chip 316. A first detector 656 may be provided on the first IC chip 652. The first detector 656 may detect light emitted by the first emitter 648, that is contained within the first communication channel 604.

Another set of substrates or leadframes 616, 620 are shown as being provided within the second communication channel 608. Substrate or leadframe 616 may support the second emitter 624 and second IC chip 628, which may be similar or identical to second emitter 340 and second IC chip 324, respectively. A second detector 632 may be provided on the second IC chip 628. Substrate or leadframe 620 may support the dual-purpose optoelectronic component 636, which may be similar or identical to dual-purpose optoelectronic component 336.

Although depicted as separate components, the substrates or leadframes 616, 620, 640, 644 may correspond to different portions of a common substrate or leadframe that has simply been separated by the mold materials 508, 512. Said another way, the substrates or leadframes 616, 620, 640, and/or 644 may be formed on a common material (e.g., a common metal leadframe), but the common material may be divided into discrete portions to establish the different communication channels 604, 608 depicted and described herein.

Figure 7:
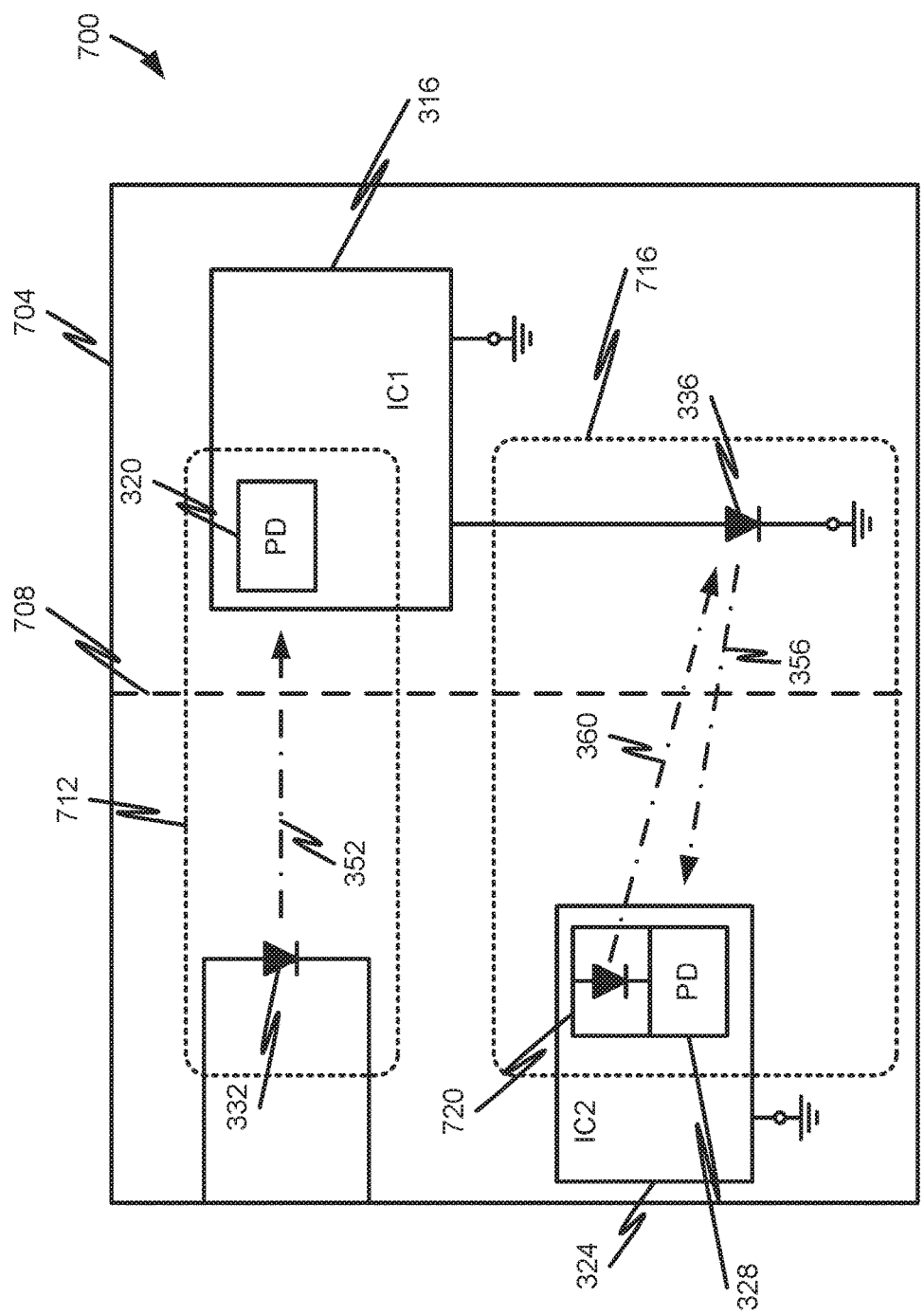
FIG. 7 is a block diagram of a third illustrative isolation device in accordance with embodiments of the present disclosure.
Figure 8:
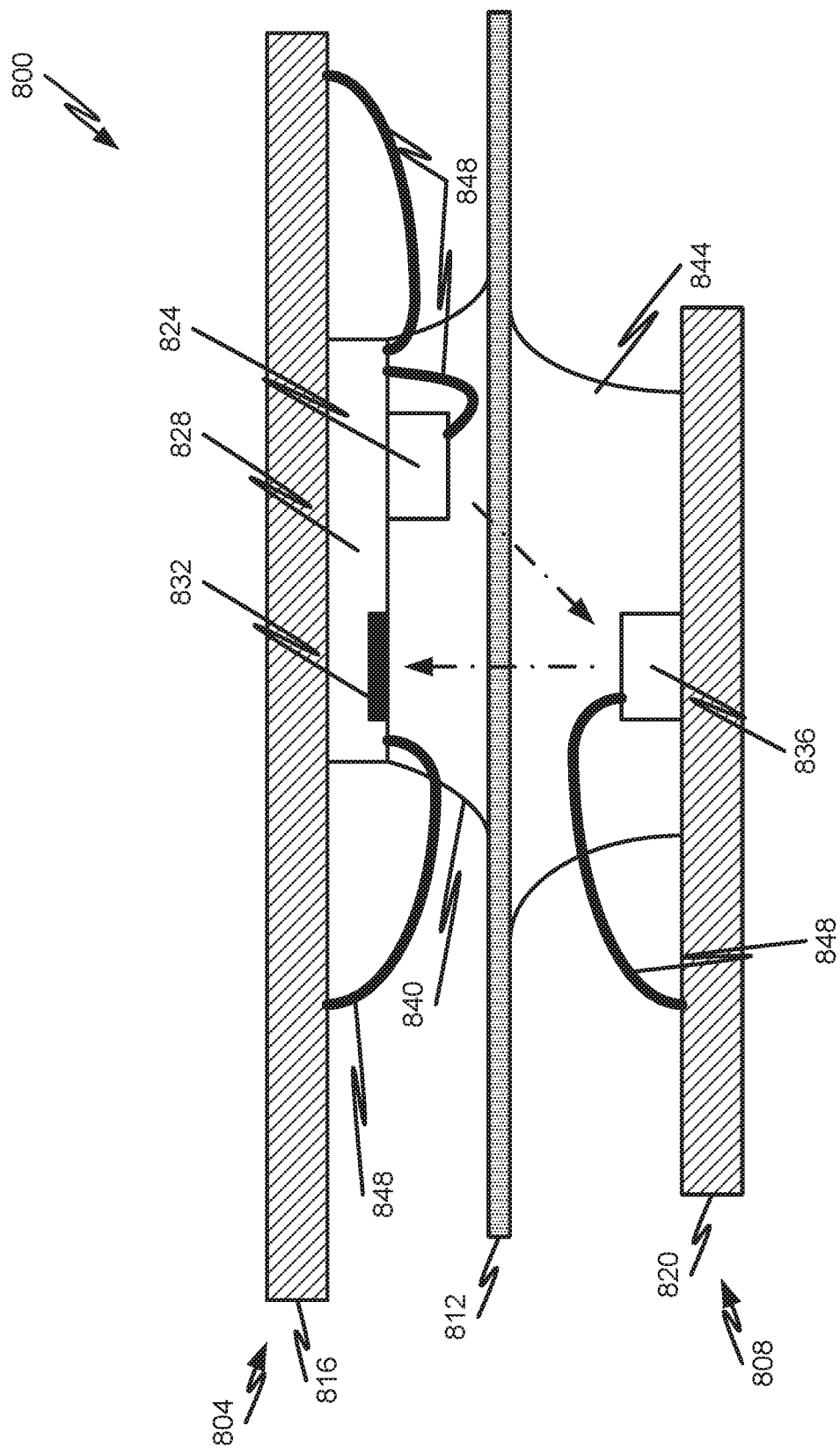
FIG. 8 is a cross-sectional view of the third illustrative isolation device in accordance with embodiments of the present disclosure.

FIG. 7 depicts a third illustrative example of an isolation device 700 in accordance with at least some embodiments of the present disclosure. FIG. 8 illustrates a portion of a similar isolation device 800 to that depicted in FIG. 7, with the exception that isolation device 800 shows a physical layout of some isolation components that may be included in the isolation device 700, 800. Unless otherwise described, it should be appreciated that similar components in isolation devices 700, 800 may have similar or identical features/functions without departing from the scope of the present disclosure.

With reference now to FIG. 7, the isolation device 700 is shown to include a package body 704 that houses components similar or identical to those depicted and described in connection with isolation device 300. The isolation device 700 further exhibits an isolation boundary 708 that separates a high voltage side of the device from a low voltage side of the device. The device 700 further exhibits a first light guide 712 and a second light guide 716. The first light guide 712 is provided between the first emitter 332 and first detector 320 whereas the second light guide 716 is provided between the second IC chip 324 and dual-purpose optoelectronic component 336. In some embodiments, the light guides 712, 716 may include a clear silicone or any other type of transparent or translucent material capable of carrying light across the isolation boundary 708 but not carrying electrical current across the isolation boundary 708.

The isolation device 700 also exhibits an emitter as part of the second IC chip 324 rather than providing an emitter separate from the second IC chip 324. More specifically, the second IC chip 324 still possesses the second detector 328, but the second IC chip 324 also possesses a stacked emitter 720 thereon. The stacked emitter 720 operates similar to the second emitter 340 except that the stacked emitter 720 is provided on or in the second IC chip 324.

As shown in FIG. 8, a stacked emitter 824 may be provided on top of the second IC chip 828, but on a different area on which the second detector 832 is provided. In this particular embodiment, the second detector 832 and stacked emitter 824 may share a common ground or reference voltage (e.g., a ground of the second IC chip 828). In some embodiments, the stacked emitter 824 is an LED or array of LEDs that are flip-chip attached to the second IC chip 828.

The isolation device 800 depicts the elements of isolation device 700 included in the second light guide 716. It should be appreciated that no all components of isolation device 700 are depicted in the isolation device 800 to enable a better understanding of the elements that communicate via the second light guide 716. Isolation device 800 shows a first side 804 and a second side 808. The first side 804 includes a first substrate or leadframe 816 having the second IC chip 828 mounted directly thereon. The second side 808 includes a second substrate or leadframe 820 having the dual-purpose optoelectronic component 836 mounted thereon. The dual-purpose optoelectronic component 836 and second IC chip 828 are shown as being in a face-to-face orientation (similar to other orientations depicted and described herein). The second IC chip 828 has a first side mounted to the first substrate or leadframe 816 and its opposite second side includes the second detector 832 as well as the stacked emitter 824 mounted thereto. The stacked emitter 824 may also be electrically connected to the second IC chip 828 via one or more wirebonds 848 and then the second IC chip 828 may be electrically connected to the first substrate or leadframe 816 via another set of wirebonds 848. Likewise, the dual-purpose optoelectronic component 836 may be electrically connected to the second substrate or leadframe 808 via one or more wirebonds 848.

An isolation or insulation material 812 is shown to electrically isolate or separate the first side 804 from the second side 808. The isolation or insulation material 812 may be similar or identical to isolation material 412. The isolation material 812 is shown as being positioned between a first encapsulant 840 and a second encapsulant 844. The first encapsulant 840 may correspond to an amount of clear or semi-transparent silicone deposited over the top of the second IC chip 828 and stacked emitter 824. The second encapsulant 844 may correspond to an amount of clear or semi-transparent silicone deposited over the dual-purpose optoelectronic device 836. The combination of the first encapsulant 840 and second encapsulant 844 may create the second light guide 716 that facilitates communications between the different sides of the isolation device 700, 800.

Figure 9:
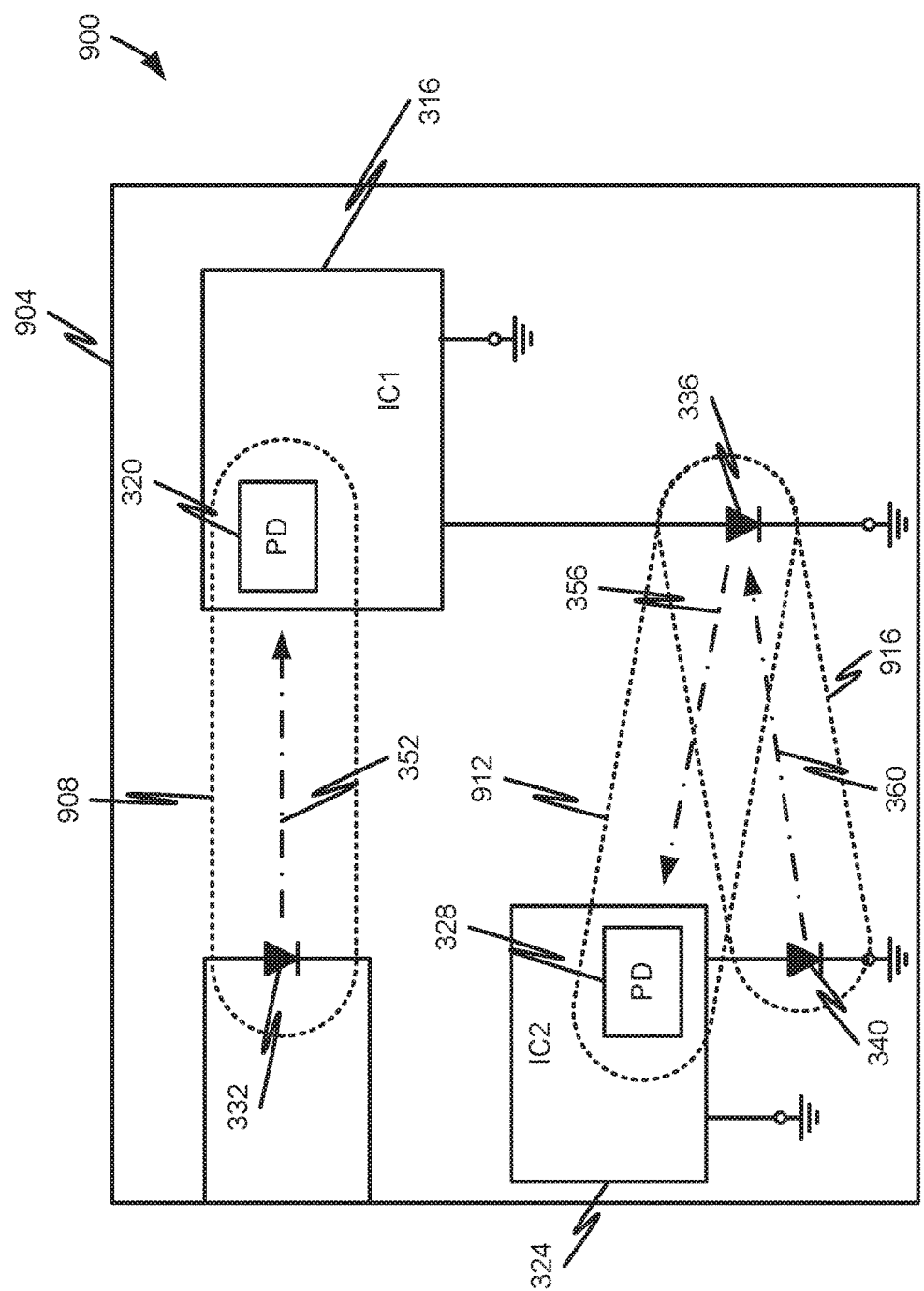
FIG. 9 is a block diagram of a fourth illustrative isolation device in accordance with embodiments of the present disclosure.

FIG. 9 depicts a fourth illustrative example of an isolation device 900 in accordance with at least some embodiments of the present disclosure. The isolation device 900 is similar to other isolation devices depicted and described herein except that the package 904 of the isolation device 900 contains three discrete light guides 908, 912, 916. The first light guide 908 may correspond to an amount of clear or semi-transparent material (e.g., silicone) deposited over the first emitter 332 and the first detector 320. It should be appreciated that the first light guide 908 may also partially or completely cover the rest of the first IC chip 316 without departing from the scope of the present disclosure.

The second light guide 912 may correspond to a second amount of clear or semi-transparent material (e.g., silicone) deposited over the second detector 328 and the dual-purpose optoelectronic device 336. The third light guide 916 may correspond to a third amount of clear or semi-transparent material (e.g., silicone) deposited over the second emitter 340 and the dual-purpose optoelectronic device 336. In some embodiments, all of the light guides 908, 912, 916 may be further encapsulated by an inner mold material (e.g., white silicone or epoxy/plastic). This inner mold material may be further encapsulated by an outer mold material (e.g., black epoxy/plastic) that establishes the final format of the package 904.

Figure 10:
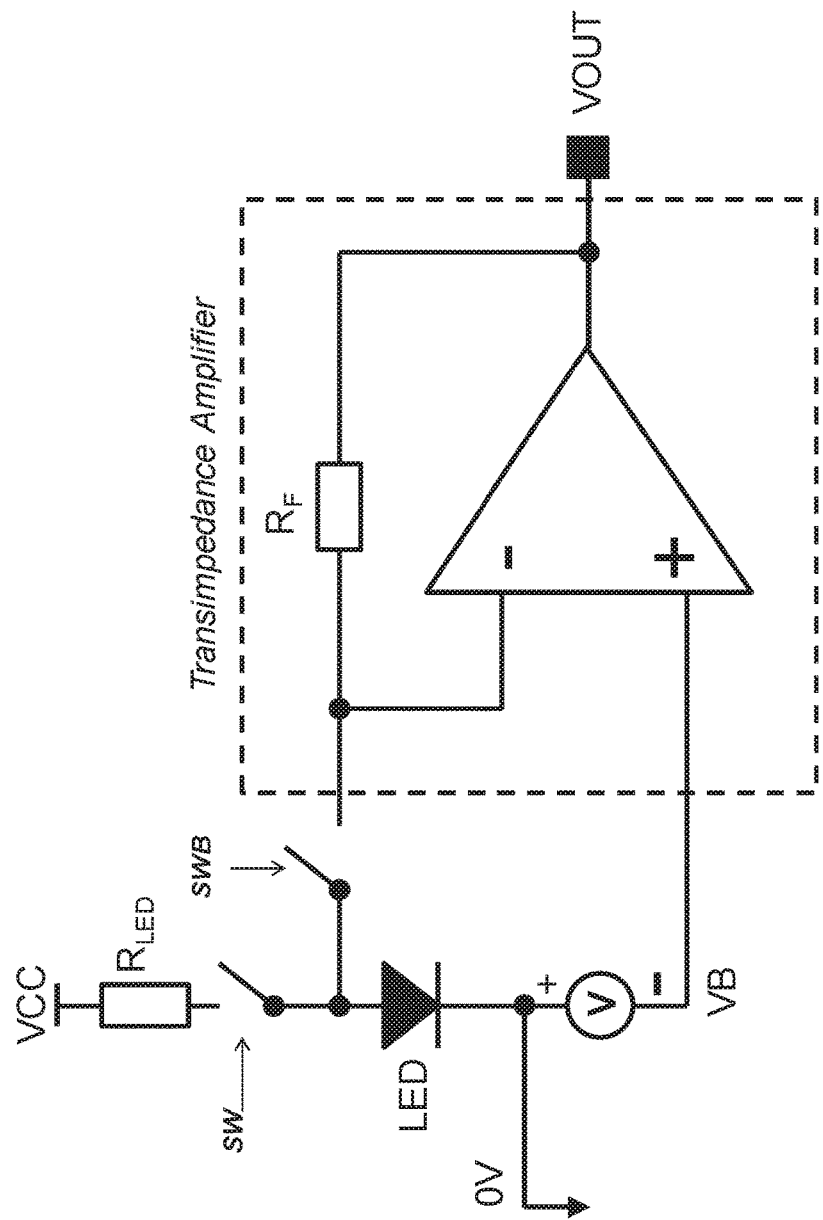
FIG. 10 is a circuit diagram depicting an illustrative circuit used to operate a dual-purpose optoelectronic component in accordance with embodiments of the present disclosure.

With reference now to FIG. 10, an illustrative control circuit used to effect the functionality of the dual-purpose optoelectronic device, which is illustratively depicted as LED. The components of the circuit may be incorporated into the first IC chip 316 (e.g., as internal components of the first IC chip 316). In some embodiments, the control circuit enables the dual-purpose optoelectronic device to be configured as a light source/emitter in one mode of operation and as a light detector in another mode of operation.

In the depicted embodiment, one node of the dual-purpose optoelectronic device is connected to a ground or reference voltage, which is also connected to a voltage source or power supply VB. The voltage source or power supply VB may correspond to a negative power supply that is also connected to a positive terminal of a transimpedance amplifier (TIA). The other node of the dual-purpose optoelectronic device is connected between a pair of switches SW and SWB. The first switch SW may selectively connect the dual-purpose optoelectronic device to a control voltage VCC through a resistor RLED. The second switch SWB may selectively connect the dual-purpose optoelectronic device to a negative terminal of the TIA. In a first mode of operation or configuration, the circuit may be configured such that the first switch SW is closed, thereby connecting the dual-purpose optoelectronic device to the control voltage VCC. In this first mode of operation or configuration, the second switch SWB may be open. When the first switch SW is closed and the second switch SWB is open, the dual-purpose optoelectronic device may operate as a light source/emitter, thereby enabling the transmission of the second optical signal 356. The resistor RLED helps to limit the amount of current flowing to the dual-purpose optoelectronic device during this mode of operation.

In a second mode of operation or configuration, the circuit may be configured such that the first switch SW is opened and the second switch SWB is closed. This creates a reverse bias with the voltage source or power supply VB and causes the dual-purpose optoelectronic device to operate as a light detector or photodiode. In some embodiments, when the second switch SWB is closed, the TIA is able to convert the photodetected current (e.g., the output of the dual-purpose optoelectronic device) into a voltage that can be read out by other components within the first IC chip 316 or by other components connected to the first IC chip 316 via a wirebond. In other words, the TIA can produce an output voltage VOUT that is representative of an electrical signal produced by the dual-purpose optoelectronic device when photons are detected at the dual-purpose optoelectronic device.

As can be appreciated, by utilizing a dual-purpose optoelectronic device as depicted and described herein, an isolation device is realized with a relatively reduced package size and/or footprint. Moreover, with the elimination of an additional IC chip and corresponding diode, the overall real estate of the isolation device package can be reduced.

As can be appreciated, any of the isolators or isolation devices depicted and described herein may be implemented as on-chip solutions (e.g., as a single silicon wafer). In some embodiments, the isolators or isolation devices may be implemented in an Integrated Circuit (IC) chip having other circuit elements provided therein. Moreover, the terms isolator and isolation device may be interchangeable terms as used herein. Indeed, any system, system component, or specific device exhibiting features and/or functions of an electrical isolator as well as an optical coupler may be considered either an isolator or isolation device.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. An isolation device comprising:
   a first circuitry having at least a first emitter and a first detector;
   a second circuitry having at least a dual-purpose component;
   an isolation material configured to electrically isolate the first circuitry from the second circuitry; and
   a switching circuitry adapted to connect the dual-purpose component to emit a first signal for detection by the first detector in a first configuration, and to receive a second signal from the first emitter in a second configuration.

2. The isolation device of claim 1 further comprising an encapsulation material encapsulating the first emitter, the first detector, the dual-purpose component and a portion of the isolation material.

3. The isolation device of claim 1 wherein the first detector is configured to generate a conflict signal indicating that the first emitter and the dual-purpose component are emitting the first and second signal respectively at the same time.

4. The isolation device of claim 1 further comprising a light guide configured to direct the first signal emitted by the dual-purpose component to the first detector, and to direct the second signal received by the dual component from the first emitter.

5. The isolation device of claim 4 wherein the light guide further comprises a first sub-chamber covering at least the first detector, and a second sub-chamber covering the dual-purpose component.

6. The isolation device of claim 5 wherein the isolation material is sandwiched between the first sub-chamber and the second sub-chamber.

7. The isolation device of claim 5 wherein the first sub-chamber has a first diameter, and the second sub-chamber has a second diameter that is greater than the first diameter.

8. The isolation device of claim 5 further comprising a limiting structure configured to limit the size of the second sub-chamber during a manufacturing state when the second sub-chamber is in liquid form.

9. The isolation device of claim 8 wherein the limiting structure comprises at least one of a dummy wire, a dummy chip, a lead frame material, a tape, and a solid structure attached adjacent to the second sub-chamber.

10. The isolation device of claim 5 wherein the first sub-chamber is configured to cover the first emitter.

11. The isolation device of claim 5 wherein the light guide further comprises a third sub-chamber covering the first emitter and wherein the isolation material is covered by the first and third sub-chambers on a first side, and is covered by the second sub-chamber on a second side opposing the first side.

12. The isolation device of claim 4 further comprising a first semiconductor die having a plurality of bond pads at a first end and the first detector at a second end, wherein the light guide is covering the first detector at the second end, and wherein the light guide is distanced away from the plurality of bond pads.

13. The isolation device of claim 4 wherein:
the first circuitry further comprises a second emitter;
the second circuitry further comprises a second detector, wherein the second emitter is adapted to emit an additional signal for detection by the second detector; and comprising
an additional light guide configured to direct the additional signal emitted by the second emitter to the second detector, and wherein the additional light guide is optically isolated from the light guide.

14. The isolation device of claim 13 wherein the first signal is transmitted at a first rate in the first configuration, the second signal is transmitted at a second rate in the second configuration, and the additional signal is transmitted at a third rate, wherein the third rate is at least 50% faster than the second rate.

15. The isolation device of claim 14 wherein the third rate is substantially the same as the first rate.

16. The isolation device of claim 13 further comprising a mold separator optically isolating the light guide and the additional light guide.

17. The isolation device of claim 1 further comprising a trans-impedance amplifier, and the switching circuitry comprises a first switch and a second switch, wherein in the first configuration, the first switch is turned on, electrically connect the dual-purpose component to receive a driving current so as to emit the first signal while the second switch is turned off, and in the second configuration the first switch is turned off while the second switch is turned on to electrically connect the dual-purpose component to the trans-impedance amplifier.

18. The isolation device of claim 1 wherein the dual-purpose component is a diode that is forward biased to emit the first signal in the first configuration, and is reverse biased to receive the second signal in the second configuration.

19. An isolation device, comprising:
a first circuitry having at least a first emitter and a first detector;
a second circuitry having at least a dual-purpose component an isolation material configured to electrically isolate the first circuitry from the second circuitry; and
a switching circuitry adapted to connect the dual-purpose component to emit a first signal for detection by the first detector in a first configuration, and to receive a second signal from the first emitter in a second configuration, wherein the first signal is transmitted at a first rate in the first configuration, and the second signal is transmitted at a second rate that is 50% of the first rate or lower in the second configuration.

20. An isolation system, comprising:
a first optical communication channel used to carry data across an isolation barrier that separates a first circuit operating at a first voltage from a second circuit operating at a second voltage, the first optical communication channel comprising a first light emitter and a first light detector; and
at least a second optical communication channel used to carry additional data across the isolation barrier, the second optical communication channel comprising a dual-purpose optoelectronic component that is switchable between a first operating condition and a second operating condition, wherein the dual-purpose optoelectronic component emits optical signals across the at least a second optical communication channel in the first operating condition, and wherein the dual-purpose optoelectronic component receives optical signals across the at least a second optical communication channel and converts the received optical signals into electrical signals.

* * * * *